(12) United States Patent
Onuki et al.

(10) Patent No.: US 12,176,358 B2
(45) Date of Patent: Dec. 24, 2024

(54) PHOTOELECTRIC CONVERSION APPARATUS, PHOTOELECTRIC CONVERSION SYSTEM, AND MOVING BODY

(71) Applicant: CANON KABUSHIKI KAISHA, Tokyo (JP)

(72) Inventors: Yusuke Onuki, Kanagawa (JP);
Hajime Ikeda, Kanagawa (JP);
Takafumi Miki, Kanagawa (JP);
Shunichi Wakashima, Tokyo (JP);
Shuhei Hayashi, Kanagawa (JP);
Takumi Watanabe, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 477 days.

(21) Appl. No.: 17/708,640

(22) Filed: Mar. 30, 2022

(65) Prior Publication Data
US 2022/0320159 A1    Oct. 6, 2022

(30) Foreign Application Priority Data
Apr. 2, 2021    (JP) .................................. 2021-063490

(51) Int. Cl.
*H01L 27/14* (2006.01)
*H01L 27/146* (2006.01)
*B60R 1/22* (2022.01)

(52) U.S. Cl.
CPC .. *H01L 27/14605* (2013.01); *H01L 27/14623* (2013.01); *B60R 1/22* (2022.01)

(58) Field of Classification Search
CPC ......... H01L 27/14603; H01L 27/14605; H01L 27/14607; H01L 27/14623; H01L 27/1463; H01L 27/1464
See application file for complete search history.

(56) References Cited

U.S. PATENT DOCUMENTS

2020/0366858 A1* 11/2020 Shinohara .............. H04N 25/70

FOREIGN PATENT DOCUMENTS

| JP | 2009206210 A | 9/2009 |
|---|---|---|
| JP | 2015-146465 A | 8/2015 |
| JP | 2018107409 A | 7/2018 |
| JP | 2020-167348 A | 10/2020 |

* cited by examiner

*Primary Examiner* — Kevin K Pyo
(74) *Attorney, Agent, or Firm* — Canon U.S.A., Inc. IP Division

(57) ABSTRACT

An apparatus includes pixels each including a conversion unit. The conversion unit includes a first semiconductor region of a first conductivity type, a second semiconductor region of a second conductivity type, and a third semiconductor region of the first conductivity type in order from a light incident surface side, and includes an in-pixel separation portion of the second conductivity type. The second semiconductor region includes a first end and a second end opposing the first end. The conversion unit further includes a fourth semiconductor region between the first and second ends. The in-pixel separation portion separates the first semiconductor region into a first region overlapping the first end and a second region overlapping the second end in a top view from the light incident surface side. A concentration of a second conductivity type impurity is lower in the fourth semiconductor region than in the in-pixel separation portion.

20 Claims, 11 Drawing Sheets

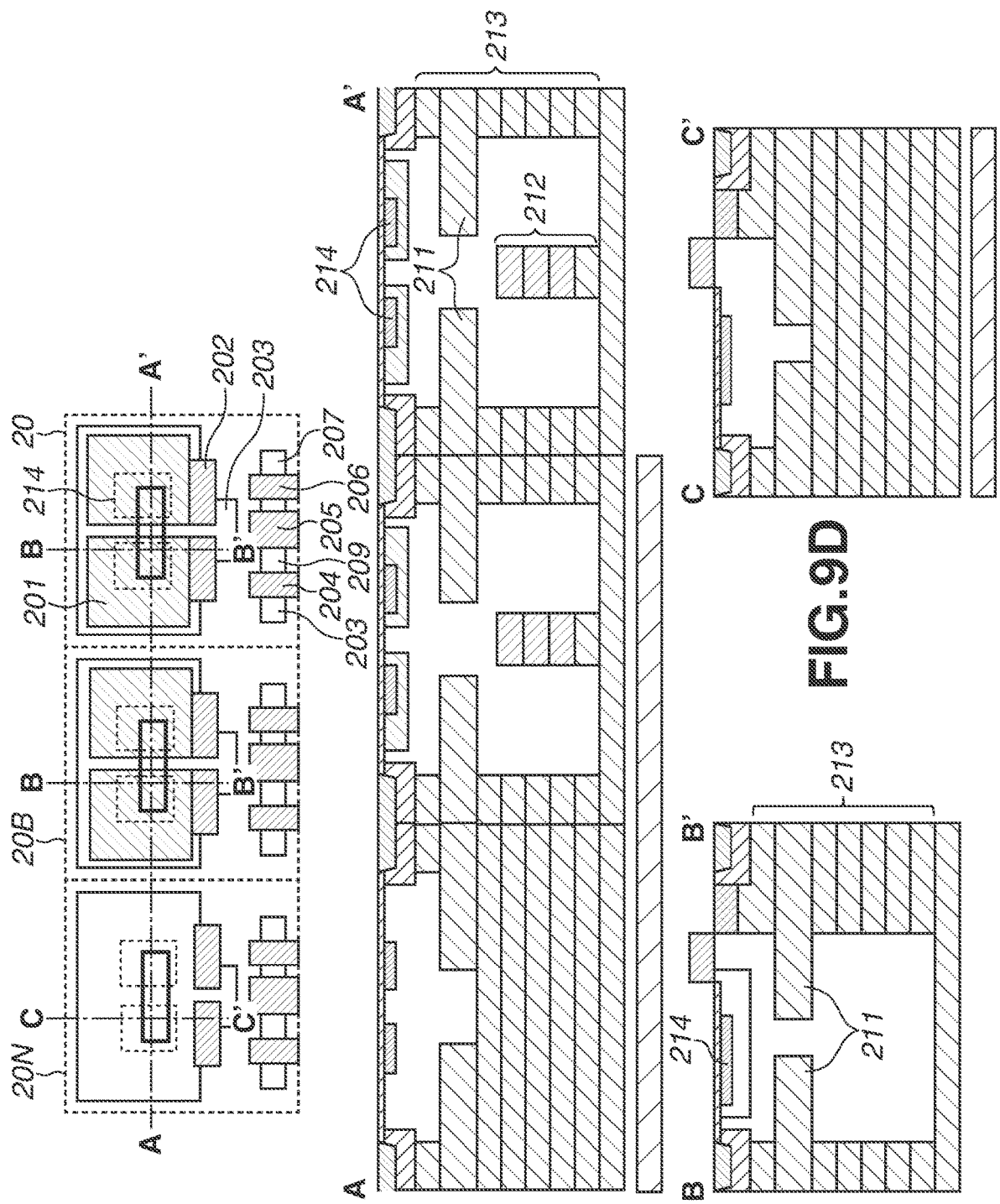

PHOTOELECTRIC CONVERSION APPARATUS, PHOTOELECTRIC CONVERSION SYSTEM, AND MOVING BODY

BACKGROUND

Field of the Disclosure

The aspect of the embodiments relates to a photoelectric conversion apparatus, a photoelectric conversion system, and a moving body using the photoelectric conversion system.

Description of the Related Art

There is known a pixel, in a photoelectric conversion apparatus, including two charge accumulation regions and having an image plane phase difference autofocus (AF) function that detects a phase difference between signals output from the two charge accumulation regions. Japanese Patent Application Laid-Open No. 2009-206210 discusses a photoelectric conversion apparatus of back surface incident type that includes a pixel having the image plane phase difference AF function.

Meanwhile, as discussed in Japanese Patent Application Laid-Open No. 2018-107409, there is known a pixel including a depletion layer stopping layer for suppressing expansion of a depletion layer below a charge accumulation region in order to increase a saturation charge amount and to suppress white spots.

In the photoelectric conversion apparatus of back surface incident type, there is an issue in a pixel including the depletion layer stopping layer and having the image plane phase difference AF function. More specifically, in a case where there is a potential barrier between the depletion layer stopping layer and the charge accumulation region, electric charge transfer from a semiconductor region, which is located below the depletion layer stopping layer and in which photoelectric conversion is performed, to the charge accumulation region is disrupted. This can cause leakage of signal electric charges into an adjacent pixel. If the leakage of signal electric charges into the adjacent pixel occurs, a resulting pseudo signal can deteriorate image quality.

SUMMARY OF THE DISCLOSURE

According to an aspect of the embodiments, an apparatus includes a plurality of pixels arranged on a substrate having a first surface where a transistor is disposed and a second surface opposite to the first surface. Each of the plurality of pixels includes a conversion unit. The conversion unit includes a first semiconductor region of a first conductivity type, a second semiconductor region of a second conductivity type, and a third semiconductor region of the first conductivity type in order from a side of the second surface, and further includes an in-pixel separation portion of the second conductivity type. The second semiconductor region includes a first end and a second end opposing the first end. The conversion unit further includes a fourth semiconductor region between the first end and the second end. The in-pixel separation portion separates the first semiconductor region into a first region overlapping the first end and a second region overlapping the second end in a top view from the side of the second surface. A concentration of an impurity of the second conductivity type in the fourth semiconductor region is lower than a concentration of an impurity of the second conductivity type in the in-pixel separation portion.

According to another aspect of the embodiments, a substrate to be laminated on another substrate includes a first surface where a transistor is disposed, a second surface opposite to the first surface, and a plurality of pixels each including a conversion unit. The conversion unit includes a first semiconductor region of a first conductivity type, a second semiconductor region of a second conductivity type, and a third semiconductor region of the first conductivity type in order from a side of the second surface. The second semiconductor region includes a first end and a second end opposing the first end. The conversion unit further includes a fourth semiconductor region between the first end and the second end. The first semiconductor region includes an in-pixel separation portion of the second conductivity type that separates the first semiconductor region into a first region overlapping the first end and a second region overlapping the second end in a top view from the side of the second surface. A concentration of an impurity of the second conductivity type in the fourth semiconductor region is lower than a concentration of an impurity of the second conductivity type in the in-pixel separation portion.

Further features of the present disclosure will become apparent from the following description of exemplary embodiments with reference to the attached drawings.

BRIEF DESCRIPTION OF THE DRAWINGS

FIG. 9A is a plan view illustrating pixels of a photoelectric conversion apparatus according to a sixth exemplary embodiment. FIGS. 9B to 9D are cross-sectional views of the pixels of the photoelectric conversion apparatus according to the sixth exemplary embodiment.

DESCRIPTION OF THE EMBODIMENTS

Figure 1:
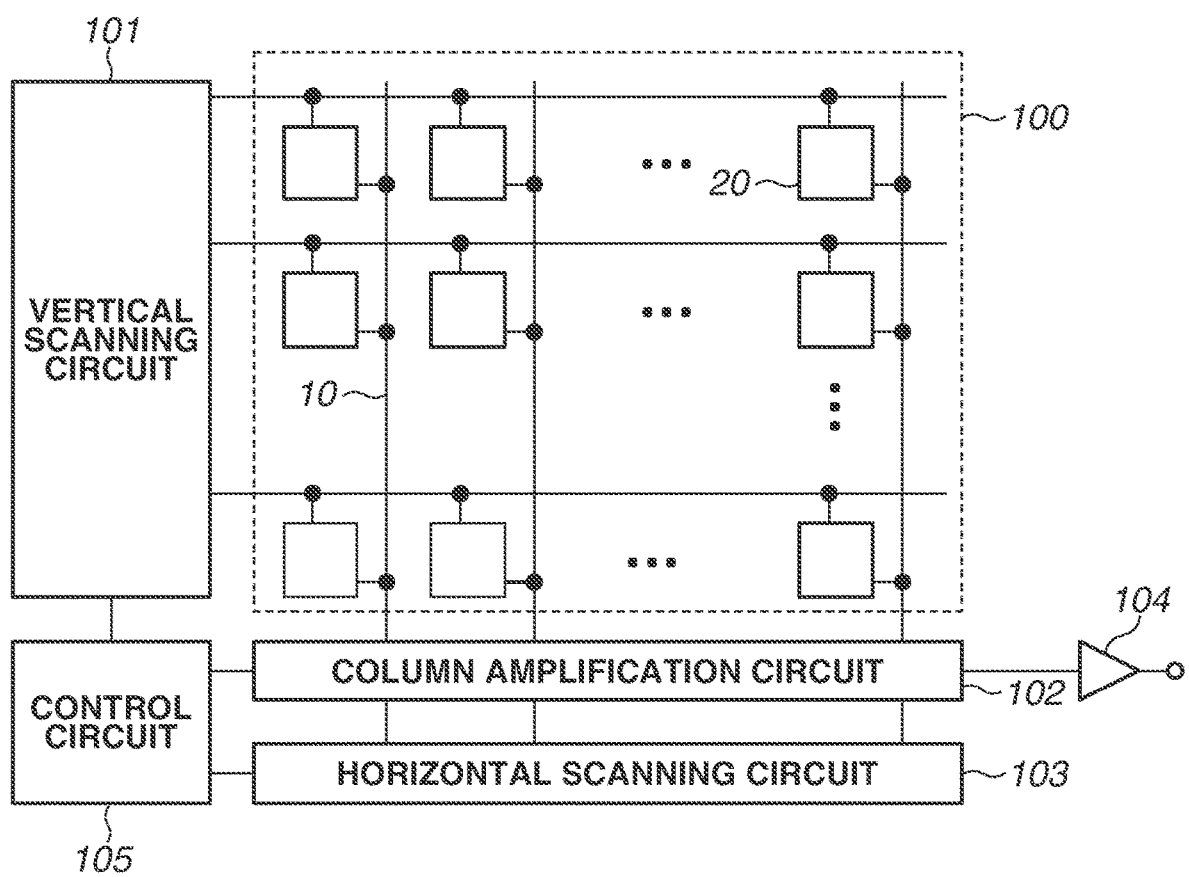
FIG. 1 is a schematic diagram illustrating a photoelectric conversion apparatus according to a first exemplary embodiment.

Exemplary embodiments of the present disclosure relating to a photoelectric conversion apparatus and a method for driving the photoelectric conversion apparatus will be described in detail below with reference to the drawings. In each of the exemplary embodiments to be described below, an imaging apparatus will be mainly described as an example of the photoelectric conversion apparatus, but each of the exemplary embodiments is not limited to the imaging apparatus and is applicable to other examples of the photoelectric conversion apparatus. The other examples include a ranging apparatus (an apparatus for measuring a distance using focus detection or time of flight (TOF)), and a photometric apparatus (an apparatus for measuring an incident light amount).

In addition, the conductivity type of a semiconductor region, the conductivity type of a well, and an implanted dopant to be described in the following exemplary embodiments are merely examples, and the exemplary embodiments are not limited to the conductivity types and the dopant described in the exemplary embodiments. The conductivity types and the dopant described in the exemplary embodiments may be appropriately changed, and the potential of each of the semiconductor region and the well may be changed appropriately according to the change.

In the following description, a transistor arrangement surface of a semiconductor substrate where a pixel is formed will be referred to as a front surface or a top, and a surface of the semiconductor substrate opposite to the front surface will be referred to as a back surface or a bottom. In the following description, a pixel (of back surface irradiation type) on which light is incident from the back surface side will be described as an example, but a structure of the pixel is not limited thereto, and the exemplary embodiments of the present disclosure are also applicable to a pixel (of front surface irradiation type) on which light is incident from the front surface side. In this case, a photoelectric conversion region below a depletion layer stopping layer is at a position further away from the light incident surface than a charge accumulation region. In such a case as well, photoelectric conversion is performed in the photoelectric conversion region, mainly using light passing through the charge accumulation region. If electric charge transfer from the photoelectric conversion region to the charge accumulation region is disrupted, an issue of leakage of signal electric charges into an adjacent pixel arises. In the back surface irradiation type, the amount of light incident on the photoelectric conversion region is larger than in the front surface irradiation type, and thus the issue tends to occur more noticeably.

Unless otherwise specified, an impurity concentration to be described in the following exemplary embodiments represents an effective impurity concentration. In a case where both a donor and an acceptor are implanted in a semiconductor region, a difference between the implanted impurity amounts is used as the effective impurity concentration of the semiconductor region.

A first exemplary embodiment of the present disclosure will be described with reference to FIGS. 1 to 4C.

FIG. 1 is a schematic diagram illustrating a configuration of a photoelectric conversion apparatus according to the present exemplary embodiment.

In FIG. 1, the photoelectric conversion apparatus includes a pixel array 100, a vertical scanning circuit 101, a column amplification circuit 102, a horizontal scanning circuit 103, an output circuit 104, and a control circuit 105.

The pixel array 100 includes a plurality of unit pixels 20 arranged in an XY matrix. The number of pixels in the pixel array 100 is not particularly limited. For example, the pixel array 100 may include pixels in several thousand rows and several thousand columns as in a general digital camera, or may include a plurality of pixels arranged in one row or one column.

The vertical scanning circuit 101 supplies control signals for controlling on and off of transistors of the unit pixels 20. For example, a logic circuit such as a shift register or an address decoder is used as the vertical scanning circuit 101. Each column of the unit pixels 20 is provided with a vertical output line 10, and signals from the unit pixels 20 in each column are read out to the vertical output line 10.

The column amplification circuit 102 amplifies the pixel signals output to the vertical output line 10, and performs correlated double sampling processing based on a signal at the time of reset and a signal at the time of photoelectric conversion.

The horizontal scanning circuit 103 supplies a control signal for controlling on and off of a switch connected to an amplifier of the column amplification circuit 102.

The output circuit 104 includes a buffer amplifier and a differential amplifier, and outputs the pixel signals from the column amplification circuit 102 to a signal processing unit outside the photoelectric conversion apparatus. An analog-to-digital (AD) conversion unit may be provided in the photoelectric conversion apparatus to output the image signals as digital signals.

Figure 2:
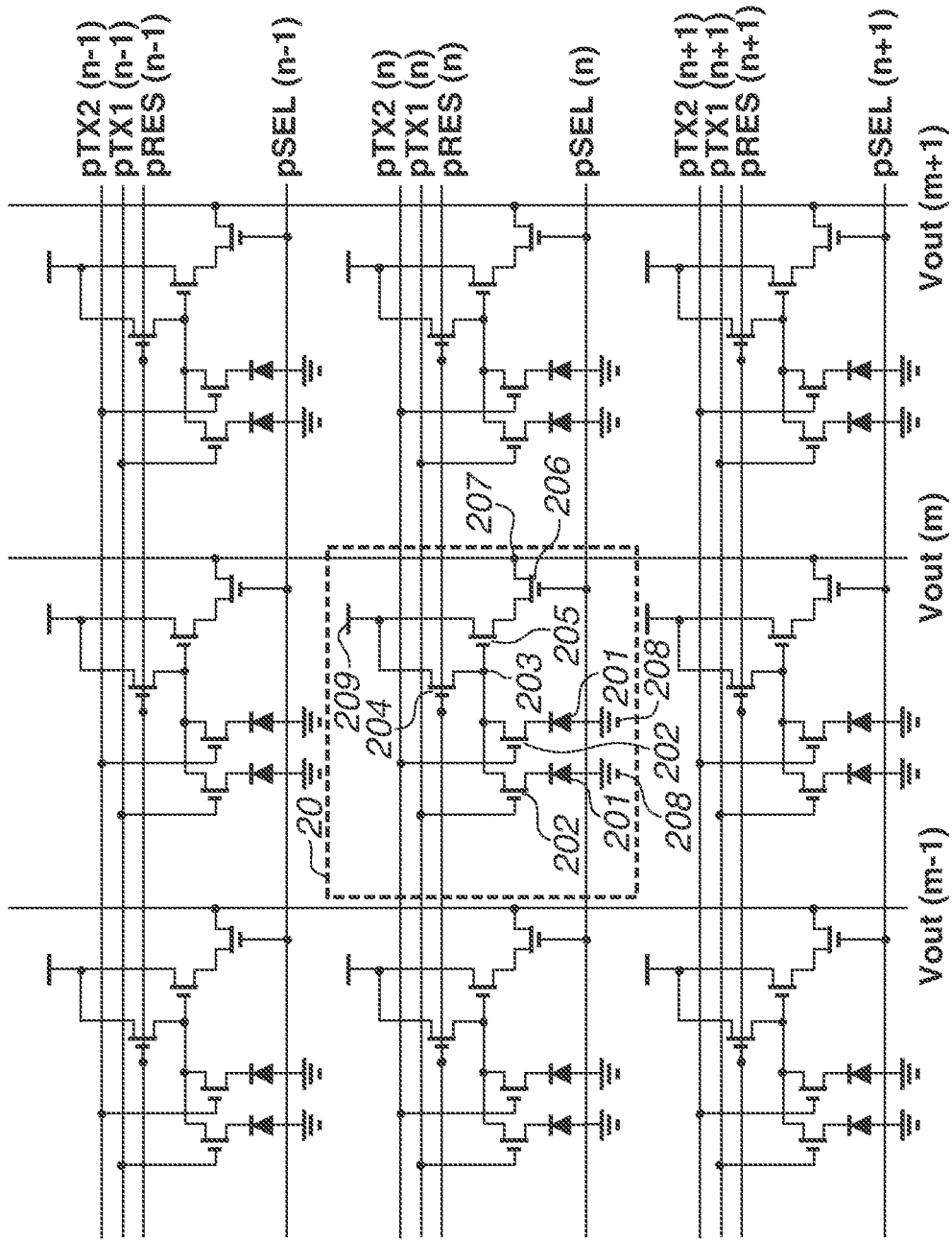
FIG. 2 is a diagram illustrating a pixel circuit of the photoelectric conversion apparatus according to the first exemplary embodiment.

FIG. 2 illustrates equivalent circuits of the unit pixels 20 in the photoelectric conversion apparatus according to the present exemplary embodiment. Among the plurality of unit pixels 20 arranged two-dimensionally in the row direction and the column direction, nine unit pixels 20 in three rows and three columns are illustrated in FIG. 2.

Each of the plurality of unit pixels 20 includes two photoelectric conversion units (hereinafter also referred to as photodiodes (PDs)) 201, two transfer transistors 202, and a floating diffusion (hereinafter also referred to as an FD) 203. Each of the unit pixels 20 has an image plane phase difference autofocus (AF) function that detects a phase difference between respective signals output from the two PDs 201. Each of the unit pixels 20 also includes a reset transistor 204, an amplification transistor 205, and a selection transistor 206. Each of the unit pixels 20 further includes an output portion 207 connected to the vertical output line 10, grounds 208 connected to a ground potential, and a power source 209.

Each of the PDs 201 photoelectrically converts incident light to generate electric charges and accumulates the generated electric charges.

When being turned on, each of the transfer transistor 202 transfers the electric charges from the corresponding PD 201 to the FD 203.

The amplification transistor 205 forms a source follower circuit, and outputs a signal based on a voltage of the FD 203 to the vertical output line 10 via the selection transistor 206. In addition, the amplification transistor 205 is capable of turning on the reset transistor 204 to reset the voltage of the FD 203 by using a voltage of the power source 209.

Control signals common to the unit pixels 20 in the same row are supplied from the vertical scanning circuit 101. More specifically, control signals pTX2(n), pTX1(n), pRES (n), and pSEL(n) are supplied to the transfer transistors 202, the reset transistors 204, and the selection transistors 206 in the n-th row, respectively. Each of the transistors is turned on when the control signal is at a high level, and turned off when the control signal is at a low level.

Figure 3A:
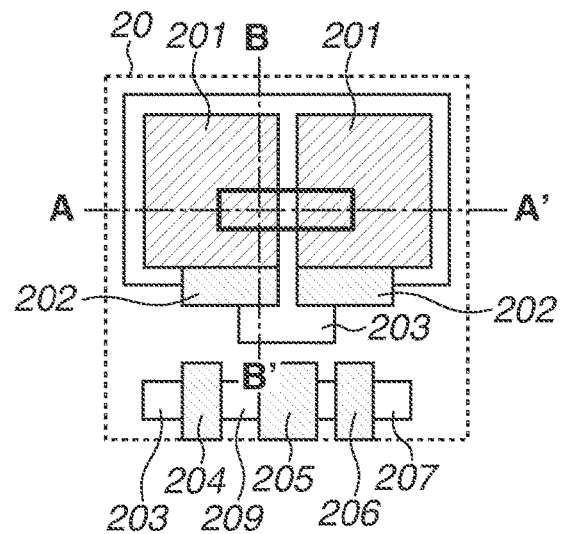
FIG. 3A is a plan view illustrating a pixel of the photoelectric conversion apparatus according to the first exemplary embodiment.
Figure 3B:
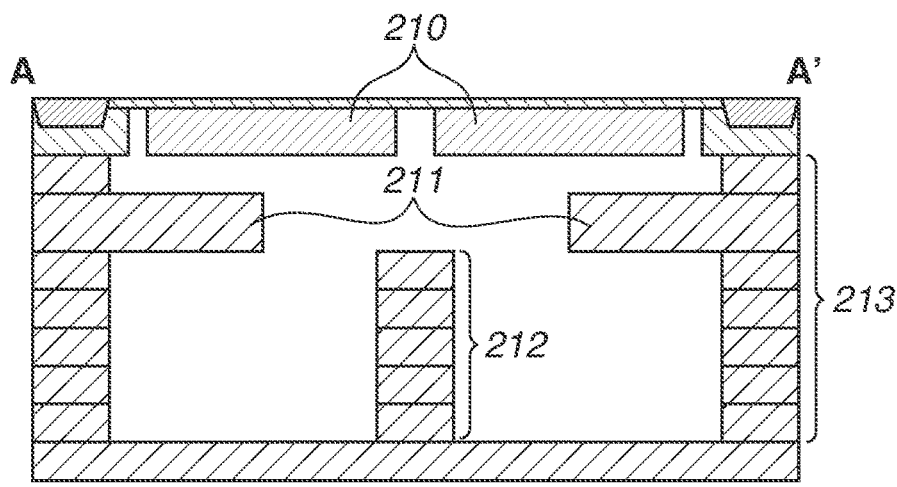
FIGS. 3B and 3C are cross-sectional views each illustrating the pixel of the photoelectric conversion apparatus according to the first exemplary embodiment.
Figure 3C:
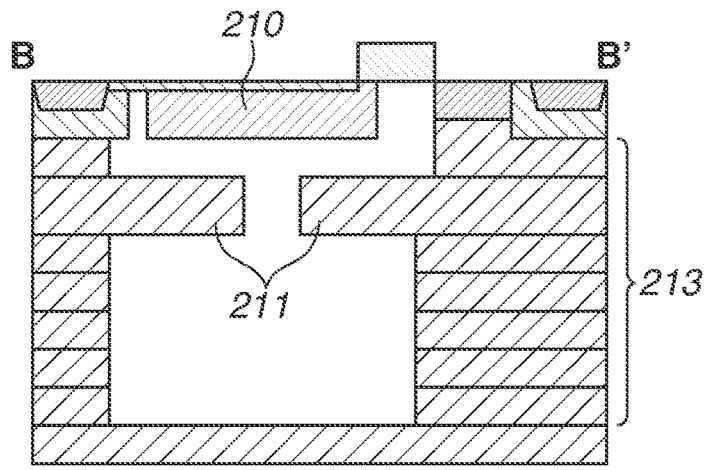

FIGS. 3A to 3C are schematic views of each of the unit pixels 20. FIG. 3A is a schematic plan view of each of the unit pixels 20. FIG. 3B is a schematic view of a cross section taken along a line A-A' in FIG. 3A. FIG. 3C is a schematic view of a cross section taken along a line B-B' in FIG. 3A.

A rectangular region indicated by a thick line in FIG. 3A is a slit portion of a depletion layer stopping region 211 to be described below with reference to FIG. 3B. As illustrated in FIGS. 3B and 3C, each of the PDs 201 in the unit pixel 20 includes an N-type charge accumulation region 210, a P-type depletion layer stopping region 211, an in-pixel separation portion 212, and a pixel separation region 213.

A structure and a function of each of the PD 201s will be described.

In the present exemplary embodiment, as illustrated in FIG. 3B, in the cross section taken along the line A-A' in FIG. 3A, the P-type depletion layer stopping region 211 for suppressing expansion of a depletion layer is formed below the N-type charge accumulation region 210. The depletion layer stopping region 211 includes an independent slit portion, and has a structure in which a first end of the slit portion and a second end of the slit portion opposing the first end are separated to the left and right in the cross section taken along the line A-N. In FIG. 3A, the slit portion of the depletion layer stopping region 211 is illustrated as an independent region for each of the depletion layer stopping regions 211 of the unit pixels 20, but the structure of the depletion layer stopping region 211 is not limited thereto. For example, a slit extending over an entire area in the direction of the line A-A' may be formed along the line A-A'. Each of the depletion layer stopping regions 211 of the unit pixels 20 may be formed of a plurality of members.

An N-type semiconductor region below the depletion layer stopping region 211 is separated into left and right portions by the P-type in-pixel separation portion 212. Each of the left and right portions of the N-type semiconductor region forms the PD 201, so that the image plane phase difference AF function can be implemented.

The PDs 201 of the unit pixels 20 adjacent to each other are separated by the P-type pixel separation region 213.

Light incident from the back surface side in FIG. 3A, i.e., from the bottom side in FIG. 3B, is photoelectrically converted mainly in the N-type semiconductor region. Electric charges generated by the photoelectric conversion in each of the PDs 201 move to the charge accumulation region 210 through the portion (the slit portion) between the left and right portions of the depletion layer stopping region 211.

A movement path of the electric charges generated by the photoelectric conversion in each of the PDs 201 will be described with reference to schematic potential diagrams of FIGS. 4B and 4C.

Figure 4A:
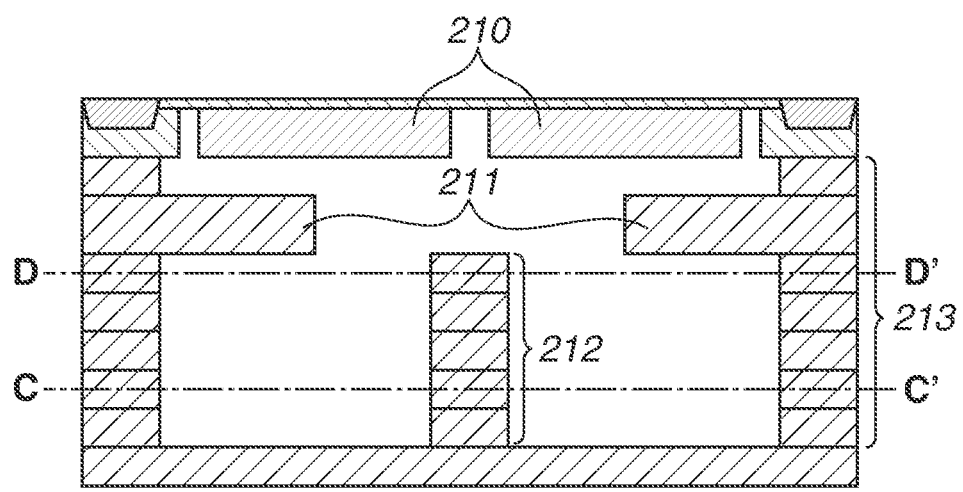
FIG. 4A is a cross-sectional view illustrating the pixel of the photoelectric conversion apparatus according to the first exemplary embodiment.

FIG. 4A is a cross-sectional view identical to FIG. 3B. FIG. 4B is a schematic potential diagram of a cross section taken along a line C-C' in FIG. 4A. FIG. 4C is a schematic potential diagram of a cross section taken along a line D-D' near the slit portion in FIG. 4A. The vertical axis in each of FIGS. 4B and 4C indicates the potential.

In each of the unit pixels 20, the potential of the N-type semiconductor region in the cross section taken along the line C-C' closer to the back surface of the photoelectric conversion apparatus is lower than the potential of each of the in-pixel separation portion 212 and the pixel separation region 213, and a potential well is formed. The potential of the N-type semiconductor region in the cross section taken along the line D-D' closer to the front surface is lower than the potential of the N-type semiconductor region on the back surface side. The potential of the in-pixel separation portion 212 in the cross section taken along the line D-D' is lower than the potential of the in-pixel separation portion 212 in the cross section taken along the line C-C', and is lower than the potential of the N-type semiconductor region in the cross section taken along the line C-C'.

In other words, each of the unit pixels 20 has a configuration in which, while a potential barrier by the pixel separation region 213 is within each of the PDs 201, the potential decreases from the back surface side to the front surface side of the photoelectric conversion apparatus, and a deep potential well is formed on the front surface side.

An effect of the present exemplary embodiment will be described.

In general, in a case where a potential barrier is present in a path from an N-type semiconductor region to a charge accumulation region of a PD, electric charges unable to go over the potential barrier can leak into an adjacent PD. In a case where the electric charges leak into the adjacent PD within each pixel, an image plane phase difference AF function can deteriorate. In addition, in a case where, for example, each pixel has a color filter, and color filters of adjacent pixels correspond to colors different from each other as in a Bayer array, there is a concern that leakage of electric charges into an adjacent PD of an adjacent pixel causes degradation of image quality due to occurrence of color mixture.

Figure 4B:
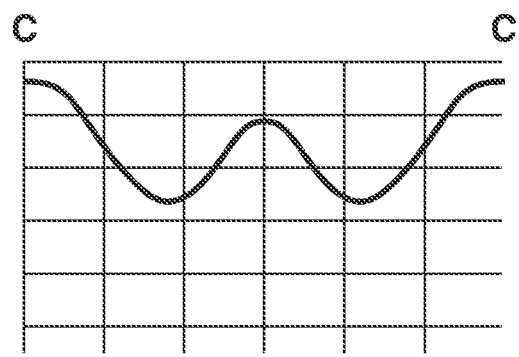
FIGS. 4B and 4C are cross-sectional potential diagrams of the pixel of the photoelectric conversion apparatus according to the first exemplary embodiment.
Figure 4C:
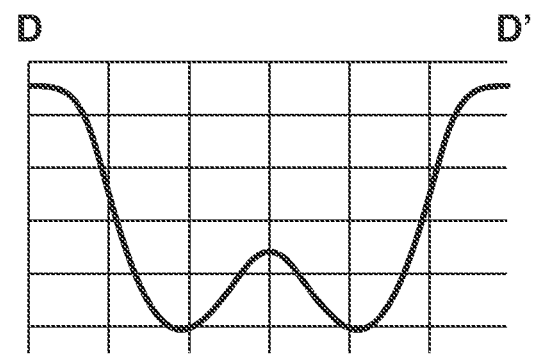

Even if no potential barrier is present in the electric charge transfer path, in a case where high luminance light is incident and a large amount of electric charges are held in the charge accumulation region, the potential of the potential well on the front surface side (the cross section taken the line D-D') of the photoelectric conversion apparatus illustrated in FIG. 4B increases. If the potential of the potential well on the front surface side of the photoelectric conversion apparatus increases, the electric field from the potential well on the back surface side (the cross section taken along the line C-C') of the photoelectric conversion apparatus illustrated in FIG. 4A to the potential well on the front surface side of the photoelectric conversion apparatus weakens, and the movement of the electric charges is disrupted by the lack of a drift. The leakage of electric charges into the adjacent PD can occur in such a case as well.

An area most likely to have the potential barrier in the path from the N-type semiconductor region on the back surface side to the charge accumulation region 210 on the front surface side is an area near the slit portion where the depletion layer stopping region 211 and the in-pixel separation portion 212 are close to each other. The depletion layer stopping region 211 and the in-pixel separation portion 212 are formed by ion implantation using boron or the like as a P-type impurity. In the area near the slit portion, the impurity is doped by expansion of the impurity in forming the depletion layer stopping region 211 and the in-pixel separation portion 212 or by thermal diffusion of the impurity, and the potential barrier is likely to be formed.

In the present exemplary embodiment, the effective concentration of the P-type impurity near the slit portion is lower than the concentration of the P-type impurity in the depletion layer stopping region 211 or the in-pixel separation portion 212. Thus, the potential near the slit portion is lower than the potential of the depletion layer stopping region 211 or the in-pixel separation portion 212 therearound, so that the movement of the electric charges from the N-type semiconductor region to the charge accumulation region 210 is facilitated.

Figure 5A:
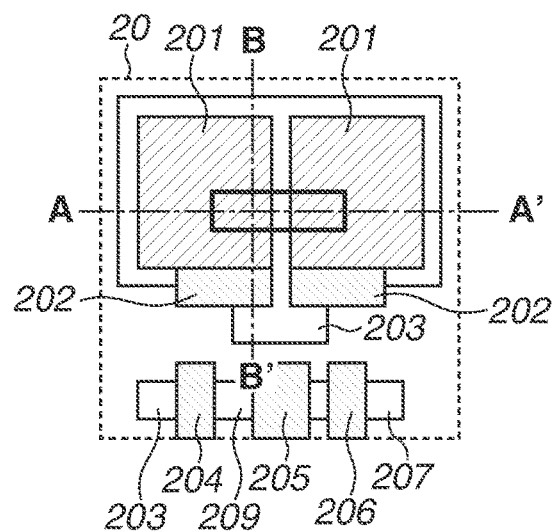
FIG. 5A is a plan view illustrating a pixel of a photoelectric conversion apparatus according to a second exemplary embodiment.
Figure 5B:
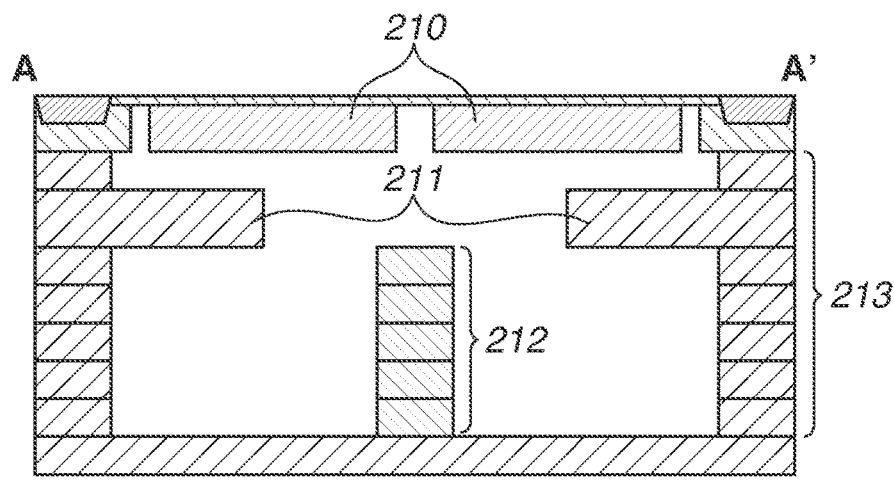
FIGS. 5B and 5C are cross-sectional views each illustrating the pixel of the photoelectric conversion apparatus according to the second exemplary embodiment.
Figure 5C:
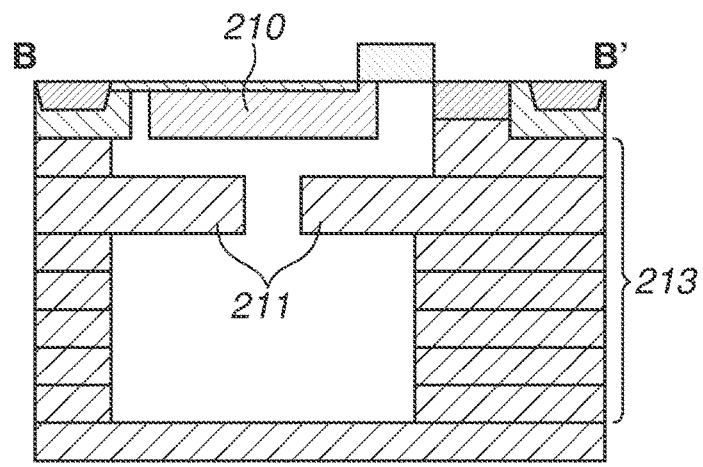

A photoelectric conversion apparatus according to a second exemplary embodiment will be described with reference to FIGS. 5A to 5C. FIG. 5A is a schematic plan view of each of the unit pixels 20. FIG. 5B is a schematic view of a cross section taken along a line A-A' in FIG. 5A. FIG. 5C is a schematic view of a cross section taken along a line B-B' in FIG. 5A. Description of parts common to the first exemplary embodiment will be omitted and a difference from the first exemplary embodiment will be mainly described.

The photoelectric conversion apparatus illustrated in FIGS. 5A to 5C is different from the photoelectric conversion apparatus illustrated in FIGS. 3A to 3C in that the P-type impurity concentration in the in-pixel separation portion 212 is low. For example, the P-type impurity concentration in the in-pixel separation portion 212 is about ½ to ½₀ as much as the P-type impurity concentration in the pixel separation region 213.

Giving a difference in the P-type impurity concentration between the pixel separation region 213 and the in-pixel separation portion 212 further reduces the effective concentration of the P-type impurity near the slit portion, and thus further decreases the potential near the slit portion.

Even in a case where the P-type impurity concentration in the pixel separation region 213 and the P-type impurity concentration in the in-pixel separation portion 212 are approximately at the same level, a similar effect can be obtained by decreasing the width of the in-pixel separation portion 212 in the cross section taken along the line A-A' that is a cross section intersecting the pixel separation direction of the in-pixel separation portion 212.

Figure 6A:
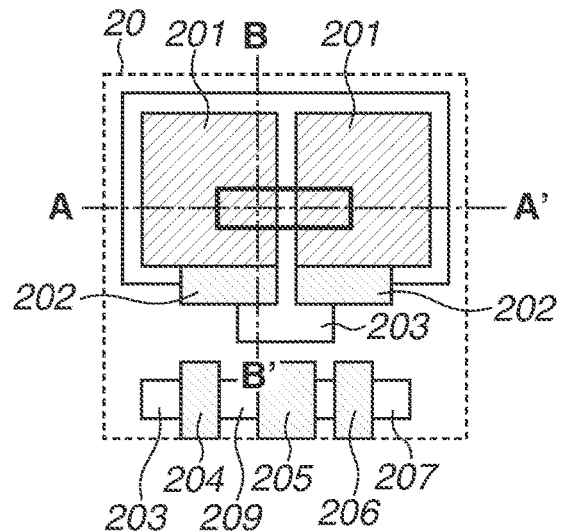
FIG. 6A is a plan view illustrating a pixel of a photoelectric conversion apparatus according to a third exemplary embodiment.
Figure 6B:
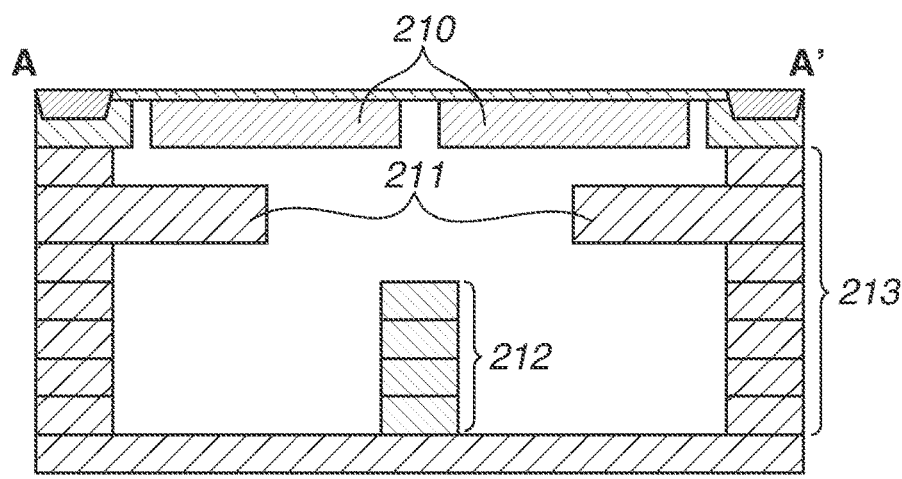
FIGS. 6B and 6C are cross-sectional views each illustrating the pixel of the photoelectric conversion apparatus according to the third exemplary embodiment.
Figure 6C:
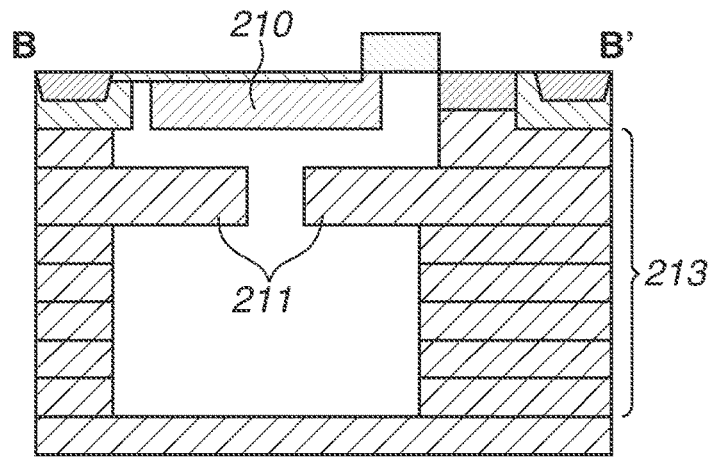

A photoelectric conversion apparatus according to a third exemplary embodiment will be described with reference to FIGS. 6A to 6C. FIG. 6A is a schematic plan view of each of the unit pixels 20. FIG. 6B is a schematic view of a cross section taken along a line A-A' in FIG. 6A. FIG. 6C is a schematic view of a cross section taken along a line B-B' in FIG. 6A. Description of parts common to the first and second exemplary embodiments will be omitted, and a difference from the second exemplary embodiment will be mainly described.

The photoelectric conversion apparatus illustrated in FIGS. 6A to 6C is different from the photoelectric conversion apparatus illustrated in FIGS. 5A to 5C in that a separation region height of the in-pixel separation portion 212 is low. The separation region height refers to an upper end height of a separation region extending from the back surface side to the front surface side in a cross-sectional view. More specifically, the upper end of the pixel separation region 213 and the upper end of the in-pixel separation portion 212 have similar heights in FIGS. 5A to 5C, whereas the upper end of the in-pixel separation portion 212 is lower than the upper end of the pixel separation region 213 in FIGS. 6A to 6C.

A possible method for forming the pixel separation region 213 and the in-pixel separation portion 212 according to the present exemplary embodiment A is to change the separation region height by performing ion implantation a plurality of times while changing energy in a separation region defined by a photoresist. The ion implantation energy in forming the in-pixel separation portion 212 is made greater than the ion implantation energy in forming the pixel separation region 213, thereby making the ion implantation depth of the in-pixel separation portion 212 and the ion implantation depth of the pixel separation region 213 different, so that the present exemplary embodiment can be implemented. Alternatively, when the in-pixel separation portion 212 is formed, ion implantation using small energy, among the plurality of times of ion implantation performed using the changed energy, is not performed, which makes the ion implantation depth of the in-pixel separation portion 212 and the ion implantation depth of the pixel separation region 213 different, so that the present exemplary embodiment can be implemented.

The P-type impurity concentration near the slit portion is further reduced by forming the in-pixel separation portion 212 to be low and positioning the upper end away from the slit portion, so that the potential near the slit portion is further decreased.

Figure 7A:
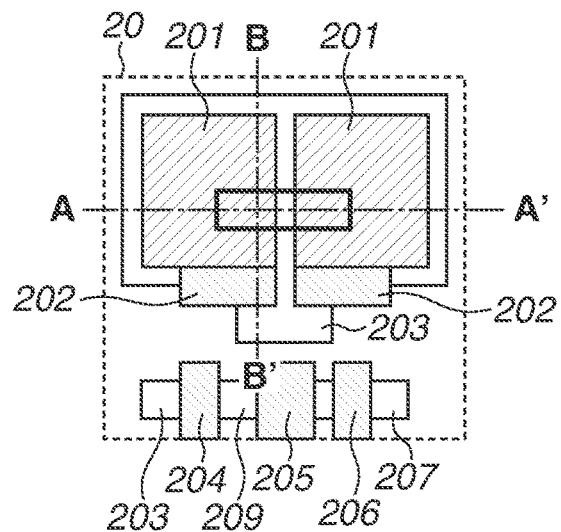
FIG. 7A is a plan view illustrating a pixel of a photoelectric conversion apparatus according to a fourth exemplary embodiment.
Figure 7B:
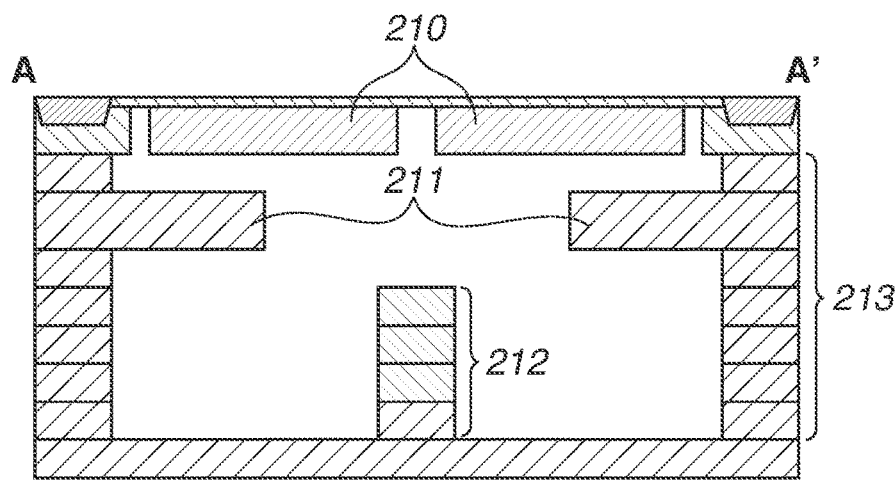
FIGS. 7B and 7C are cross-sectional views each illustrating the pixel of the photoelectric conversion apparatus according to the fourth exemplary embodiment.
Figure 7C:
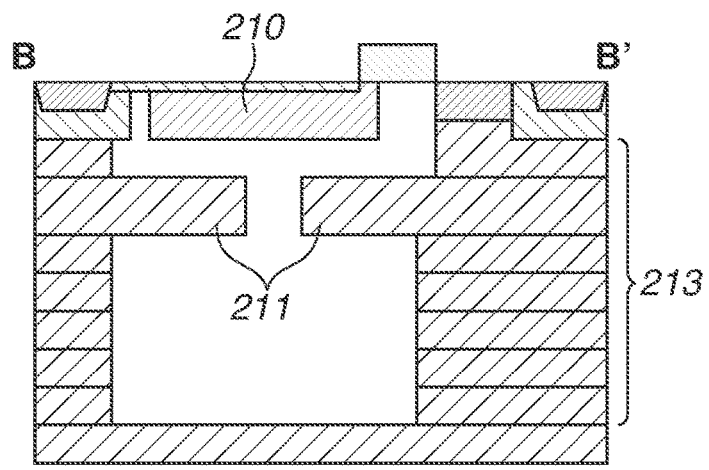

A photoelectric conversion apparatus according to a fourth exemplary embodiment will be described with reference to FIGS. 7A to 7C. FIG. 7A is a schematic plan view of each of the unit pixels 20. FIG. 7B is a schematic view of a cross section taken along a line A-A' in FIG. 7A. FIG. 7C is a schematic view of a cross section taken along a line B-B' in FIG. 7A. Description of parts common to the first to third exemplary embodiments will be omitted, and a difference from the third exemplary embodiment will be mainly described.

The photoelectric conversion apparatus illustrated in FIGS. 7A to 7C is different from the photoelectric conversion apparatus illustrated in FIGS. 6A to 6C in that the P-type impurity concentration on the back surface side of the in-pixel separation portion 212 is higher than the P-type impurity concentration on the front surface side of the in-pixel separation portion 212.

The P-type impurity concentration on the back surface side of the in-pixel separation portion 212 is made higher than the P-type impurity concentration on the front surface side of the in-pixel separation portion 212, so that the potential barrier between the PDs 201 near the back surface side is increased. Increasing the potential barrier between the PDs 201 near the back surface side suppresses crosstalk of the electric charges generated by the photoelectric conversion in the respective PDs 201, thereby improving the image plane phase difference AF function.

On the other hand, since the P-type impurity concentration on the front surface side of the in-pixel separation portion 212 is low, the P-type impurity concentration near the slit portion and the potential near the slit portion are kept low.

Figure 8A:
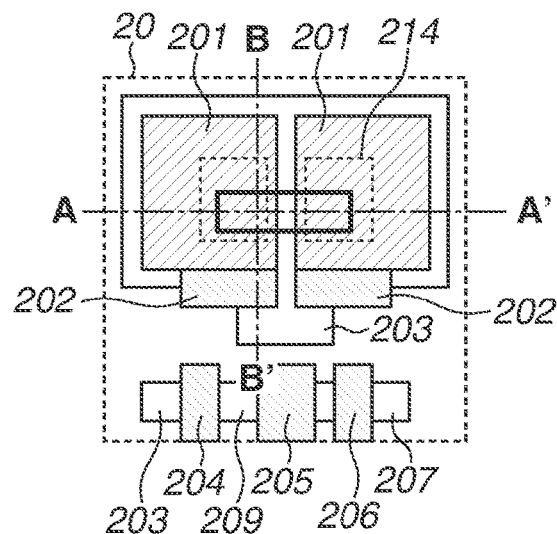
FIG. 8A is a plan view illustrating a pixel of a photoelectric conversion apparatus according to a fifth exemplary embodiment.
Figure 8B:
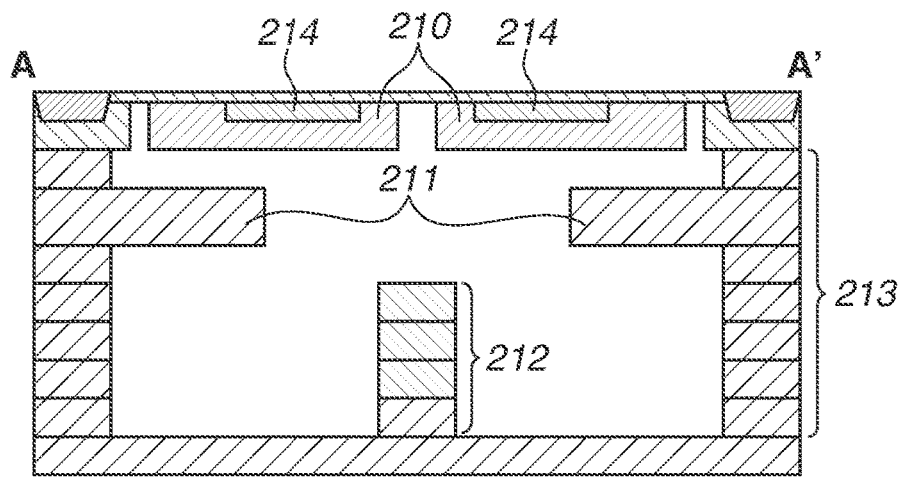
FIGS. 8B and 8C are cross-sectional views each illustrating the pixel of the photoelectric conversion apparatus according to the fifth exemplary embodiment.
Figure 8C:
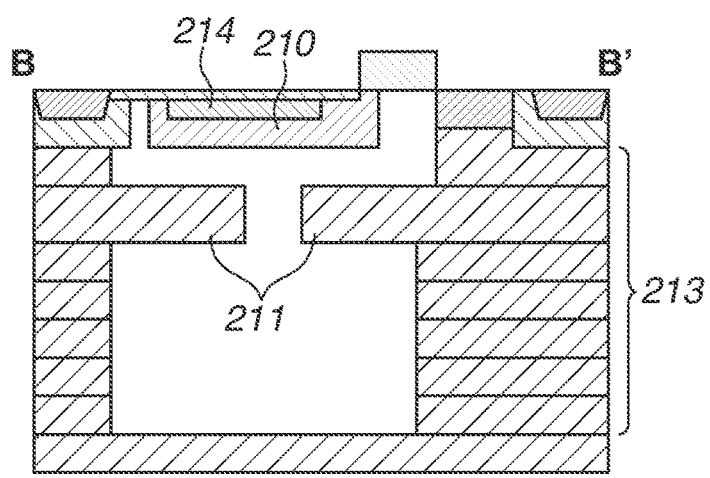

A photoelectric conversion apparatus according to a fifth exemplary embodiment will be described with reference to FIGS. 8A to 8C. FIG. 8A is a schematic plan view of each of the unit pixels 20. FIG. 8B is a schematic view of a cross section taken along a line A-A' in FIG. 8A. FIG. 8C is a schematic view of a cross section taken along a line B-B' in FIG. 8A. Description of parts common to the first to fourth exemplary embodiments will be omitted, and a difference from the fourth exemplary embodiment will be mainly described.

The photoelectric conversion apparatus illustrated in FIGS. 8A to 8C is different from the photoelectric conversion apparatus illustrated in FIGS. 7A to 7C in that a P-type counter region 214 is formed on the front surface side of the depletion layer stopping region 211 so as to overlap the slit portion. A rectangular region indicated by a thick dotted line in FIG. 8A is the counter region 214 to be described below.

In the slit portion of the depletion layer stopping region 211, the depletion layer stopping region 211 is not formed and thus a depletion voltage of the charge accumulation region 210 can locally increase and a potential valley can be formed. In a case where the electric charges remain in this valley in transferring the accumulated charges from the PD 201 to the FD 203 via the transfer transistor 202, image quality degradation such as a deterioration in linearity and an image lag can occur.

In the present exemplary embodiment, the counter region 214 is formed on the front surface side of the depletion layer stopping region 211 so as to overlap the slit portion in a top view in a light incidence direction. The counter region 214 is formed by ion implantation of the P-type impurity, such as boron, in the charge accumulation region 210. The counter region 214 increases the potential of a portion overlapping the slit portion of the depletion layer stopping region 211, and suppressing a local increase of the depletion voltage. The charge transfer from the PD 201 to the FD 203 is thereby facilitated.

In addition, as illustrated in FIG. 8A, the counter region 214 may extend in the direction opposite to the side of the transfer transistor 202 with respect to the slit portion of the depletion layer stopping region 211. The electric field by the transfer transistor 202 does not easily reach a PD region that is away from the transfer transistor 202 in the PD 201, and the movement of electric charges can be stagnated in this region. Extending the counter region 214 to the PD region away from the transfer transistor 202 to increase the potential of the PD region further facilitates the charge transfer from the PD 201 to the FD 203.

A photoelectric conversion apparatus according to a sixth exemplary embodiment will be described with reference to FIGS. 9A to 9D. The photoelectric conversion apparatus according to the present exemplary embodiment includes optical black (OB) pixels 20B shielded from light, and reference pixels 20N for obtaining a reference value of noise of a pixel portion, in addition to the unit pixels 20.

FIG. 9A is a schematic plan view of the three pixels, i.e., the unit pixel 20, the OB pixel 20B, and the reference pixel 20N. FIG. 9B is a schematic view of a cross section taken along a line A-A' in FIG. 9A. FIG. 9C is a schematic view of a cross section taken along a line B-B' in FIG. 9A. FIG. 9D is a schematic view of a cross section taken along a line C-C' in FIG. 9A. FIG. 9B schematically illustrates a light shielding film for blocking light that is disposed on the light incident surface side of each of the OB pixel 20B and the reference pixel 20N.

The structure of each of the unit pixel 20 and the OB pixel 20B is similar to the structure in the photoelectric conversion apparatus described in the fifth exemplary embodiment, and thus the detailed description thereof will be omitted. The reference pixel 20N does not have the PDs 201, and is different from the unit pixel 20 in a structure below the depletion layer stopping region 211.

Because the reference pixel 20N does not have the PDs 201, ion implantation for forming the charge accumulation region 210 is not performed, and the P-type impurity concentration is relatively high in the slit portion of the depletion layer stopping region 211. In a case where the structure of the reference pixel 20N is similar to that of the unit pixel 20 except for the PDs 201, the potential in the slit portion of the depletion layer stopping region 211 is higher than those of the unit pixel 20 and the OB pixel 20B each having the charge accumulation region 210, and the potential barrier is formed in the slit portion.

Since the reference pixel 20N does not have the PDs 201 and is shielded from light by a light shielding portion, no electric charge is generated by the photoelectric conversion, but electric charges can be generated by a dark current. In particular, in the photoelectric conversion apparatus of back surface incident type, because an Si interface is present on the back surface side, the electric charges by the dark current are likely to be generated in the N-type semiconductor region at a position close to the back surface, as compared with the photoelectric conversion apparatus of front surface incident type.

The movement of the electric charges generated in the N-type semiconductor region can be restricted by the potential barrier formed in the slit portion of the depletion layer stopping region 211, and the electric charges can be accumulated in the N-type semiconductor region. The accumulated electric charges can leak into an adjacent pixel (the OB pixel 20B or the unit pixel 20). In addition, if the electric charges accumulated in the N-type semiconductor region exceed the amount of electric charges that can be accumulated in the N-type semiconductor region, some of the excessive charges can go over the potential barrier between the reference pixel 20N and the adjacent OB pixel 20B, and enter the adjacent OB pixel 20B.

If the excessive charges enter the OB pixel 20B, a black level reference value may not be able to be accurately obtained. Furthermore, in a case where the electric charges leak from the reference pixel 20N into the unit pixel 20, there is a concern that the accuracy of a signal output from the unit pixel 20 may decrease and the image plane phase difference AF function may deteriorate.

Thus, in the photoelectric conversion apparatus according to the present exemplary embodiment, as illustrated in FIGS. 9B and 9D, an entire region located below the depletion layer stopping region 211 and corresponding to the N-type semiconductor region of the unit pixel 20 is a P-type semiconductor region. In other words, in the region below the depletion layer stopping region 211 of the reference pixel 20N, the effective concentration of the P-type impurity is high and the effective concentration of the N-type impurity is low, as compared with the region below the depletion layer stopping region 211 of each of the unit pixel 20 and the OB pixel 20B. It can be said that, when the unit pixel 20, the OB pixel 20B, and the reference pixel 20N are compared at the same depth position halving the range from the light incident surface to the depletion layer stopping region 211 in parallel to the light incident surface in each of the unit pixel 20, the OB pixel 20B, and the reference pixel 20N, the effective concentration of the P-type impurity is higher and the effective concentration of the N-type impurity is lower in the reference pixel 20N.

Because the portion below the depletion layer stopping region 211 is the P-type semiconductor region, the generation of the excessive charges in this region is suppressed. Accordingly, the entry of the excessive charges into the adjacent pixel is suppressed. The effect of suppressing the leakage of electric charges by the formation of a potential slope in each of the unit pixel 20 and the OB pixel 20B other than the reference pixel 20N is further increased, and the decline of the accuracy of output signals is further suppressed.

The P-type semiconductor region below the depletion layer stopping region 211 may be formed in the same ion implantation process as that for the P-type pixel separation region 213 that separates the adjacent pixels. Forming the P-type semiconductor region in the same process as that for the pixel separation region 213 can simplify the processes. Furthermore, in the present exemplary embodiment, the slit portion is not essential in the depletion layer stopping region 211 of the reference pixel 20N.

In the present exemplary embodiment, the semiconductor region below the depletion layer stopping region 211 is described to be the P-type semiconductor region. The effect of reducing the disruption of the electric charge transfer due to the formation of the potential barrier in the slit portion can also be obtained likewise by forming the semiconductor region to be an N-type semiconductor region having a lower concentration than that of the charge accumulation region 210 and making a formed potential well shallow.

Figure 10:
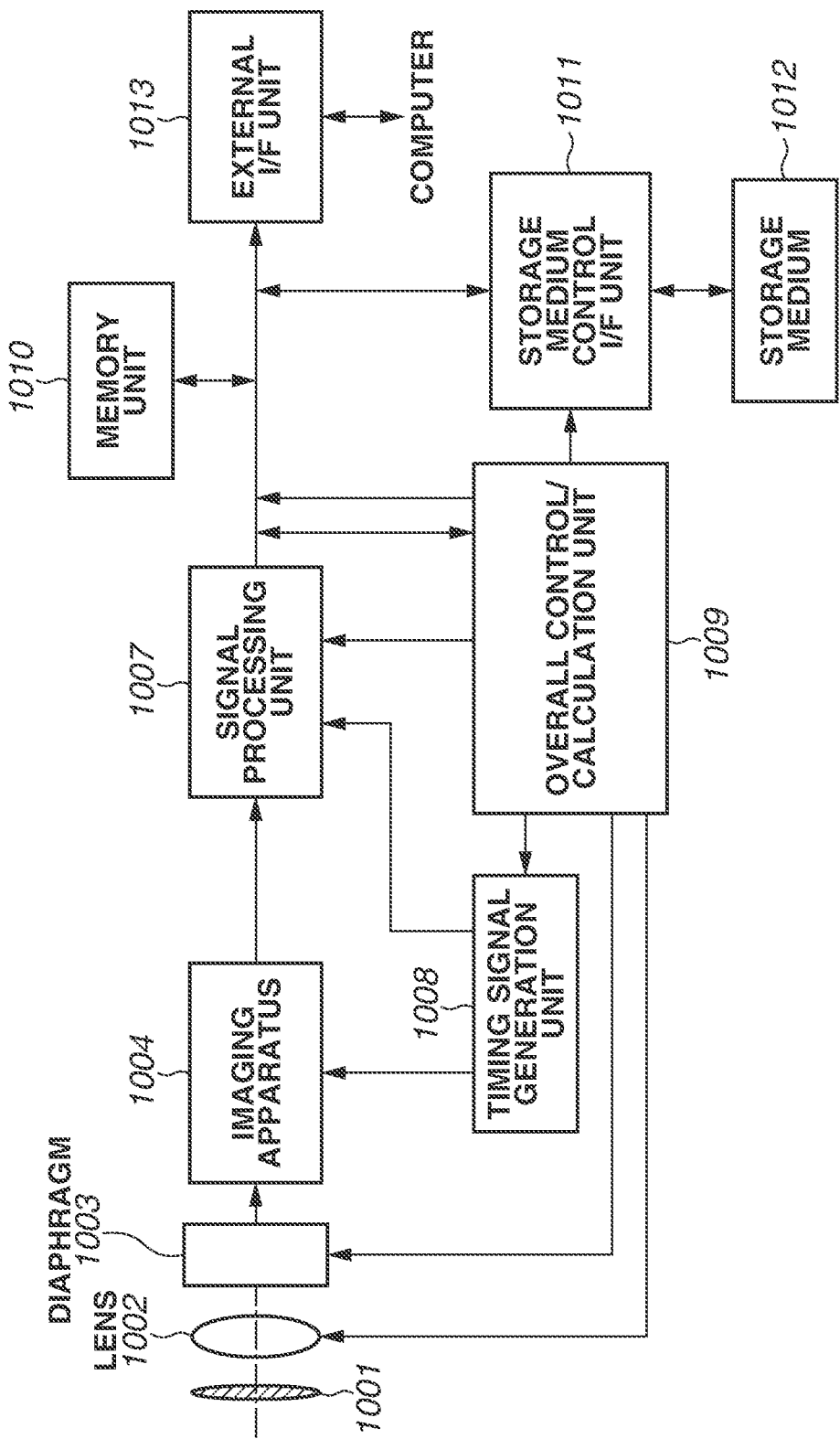
FIG. 10 is a block diagram illustrating a configuration of a photoelectric conversion system according to a seventh exemplary embodiment.

A photoelectric conversion system according to a seventh exemplary embodiment will be described with reference to FIG. 10. FIG. 10 is a block diagram illustrating a schematic configuration of the photoelectric conversion system according to the present exemplary embodiment.

The photoelectric conversion apparatus (the imaging apparatus) described in each of the first to sixth exemplary embodiments is applicable to various types of photoelectric conversion system. Examples of the various types of photoelectric conversion system include a digital still camera, a digital camcorder, a surveillance camera, a copier, a facsimile, a mobile phone, an on-vehicle camera, and an observation satellite. A camera module including an optical system such as a lens and an imaging apparatus is also included in the examples of the photoelectric conversion system. FIG. 10 is a block diagram illustrating a digital still camera as one of these examples.

The photoelectric conversion system illustrated in FIG. 10 includes an imaging apparatus 1004 serving as an example of the photoelectric conversion apparatus, and a lens 1002 for forming an optical image of a subject on the imaging apparatus 1004. The photoelectric conversion system further includes a diaphragm 1003 for varying the amount of light passing through the lens 1002, and a barrier 1001 for protecting the lens 1002. The lens 1002 and the diaphragm 1003 form an optical system that condenses light on the imaging apparatus 1004. The imaging apparatus 1004 is the photoelectric conversion apparatus (the imaging apparatus) according to any of the above-described exemplary embodiments, and converts the optical image formed by the lens 1002 into an electric signal.

The photoelectric conversion system further includes a signal processing unit 1007 serving as an image generation unit that generates an image by processing the signal output from the imaging apparatus 1004. The signal processing unit 1007 operates to perform various corrections and compression as appropriate to output image data. The signal processing unit 1007 may be formed on a semiconductor substrate where the imaging apparatus 1004 is provided, or may be formed on a semiconductor substrate different from the semiconductor substrate where the imaging apparatus 1004 is provided.

The photoelectric conversion system further includes a memory unit 1010 for temporarily storing the image data, and an external interface (I/F) unit 1013 for communicating with an external computer or the like. The photoelectric conversion system further includes a storage medium 1012 such as a semiconductor memory for recording or reading out captured image data, and a storage medium control I/F unit 1011 for recording or reading out the image data to or from the storage medium 1012. The storage medium 1012 may be built in the photoelectric conversion system or may be detachably attached thereto.

The photoelectric conversion system further includes an overall control/calculation unit 1009 that controls various arithmetic calculations and the entire digital still camera, and a timing signal generation unit 1008 that outputs various timing signals to the imaging apparatus 1004 and the signal processing unit 1007. Alternatively, the timing signals may be input from an external source, and the photoelectric conversion system may include at least the imaging apparatus 1004 and the signal processing unit 1007 that processes the signal output from the imaging apparatus 1004.

The imaging apparatus 1004 outputs an imaging signal to the signal processing unit 1007. The signal processing unit 1007 performs predetermined signal processing on the imaging signal output from the imaging apparatus 1004, and outputs image data. The signal processing unit 1007 uses the imaging signal to generate an image.

In this way, according to the present exemplary embodiment, the photoelectric conversion system to which the photoelectric conversion apparatus (the imaging apparatus) according to any of the above-described exemplary embodiments is applied can be implemented.

Figure 11A:
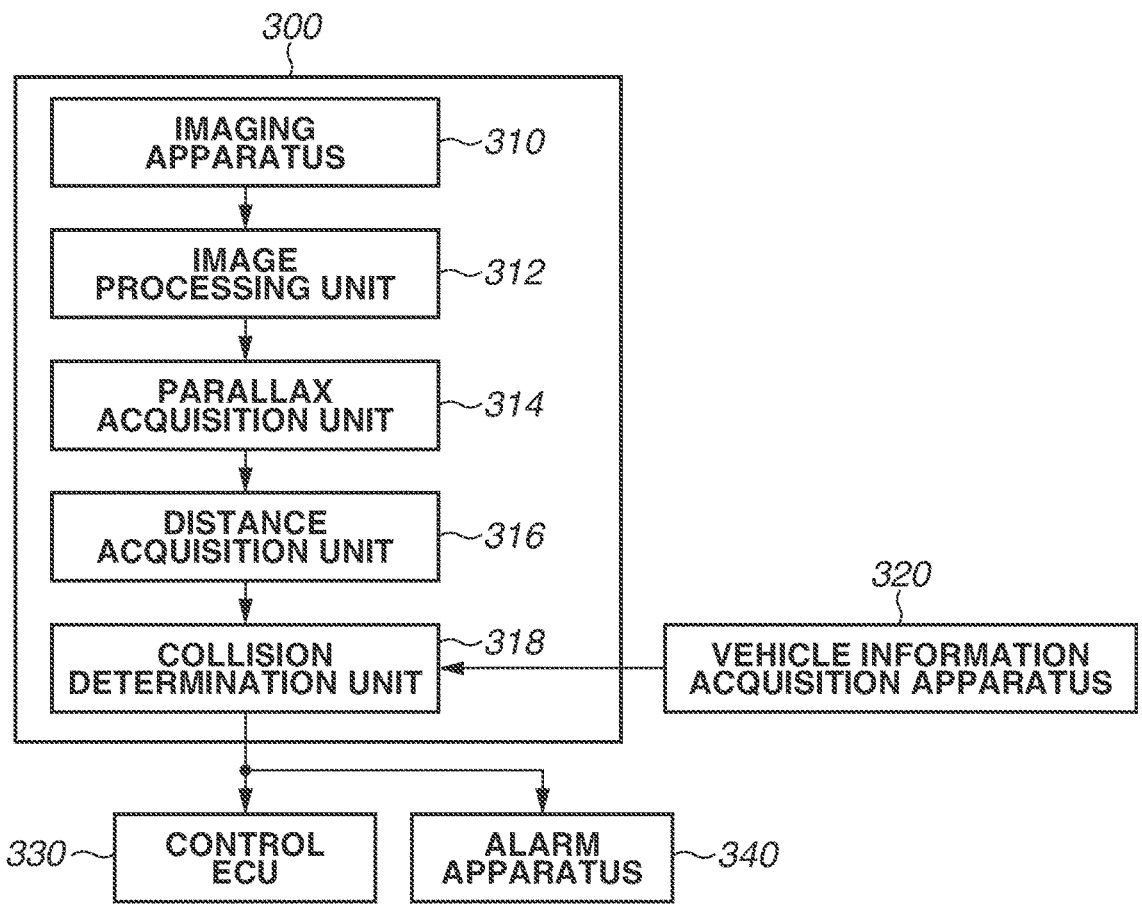
FIG. 11A is a block diagram illustrating a configuration of a photoelectric conversion system according to an eighth exemplary embodiment.
Figure 11B:
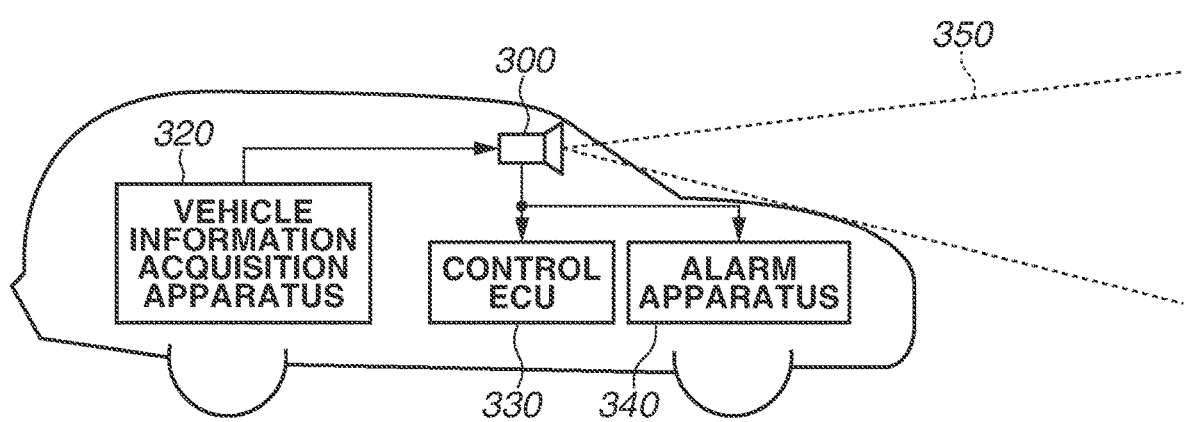
FIG. 11B is a diagram illustrating a configuration of a moving body according to the eighth exemplary embodiment.

A photoelectric conversion system and a moving body according to an eighth exemplary embodiment will be described with reference to FIGS. 11A and 11B. FIG. 11A illustrates a configuration of the photoelectric conversion system according to the present exemplary embodiment. FIG. 11B illustrates a configuration of the moving body according to the present exemplary embodiment.

FIG. 11A illustrates a photoelectric conversion system 300 for an on-vehicle camera as an example of the photoelectric conversion system. The photoelectric conversion system 300 has an imaging apparatus 310. The imaging apparatus 310 is the photoelectric conversion apparatus (the imaging apparatus) described in any of the above-described exemplary embodiments. The photoelectric conversion system 300 has an image processing unit 312 that performs image processing on a plurality of pieces of image data acquired by the imaging apparatus 310, and a parallax acquisition unit 314 that calculates a parallax (a phase difference between parallax images) from a plurality of pieces of image data acquired by the photoelectric conversion system 300. The photoelectric conversion system 300 further includes a distance acquisition unit 316 that calculates a distance to a target object based on the calculated parallax, and a collision determination unit 318 that determines whether there is a possibility of collision based on the calculated distance. The parallax acquisition unit 314 and the distance acquisition unit 316 are examples of a distance information acquisition unit that acquires distance information about a distance to a target object. In other words, the distance information is information about a parallax, a defocus amount, a distance to a target object, and the like. The collision determination unit 318 may determine a possibility of collision, using any of these pieces of distance information. The distance information acquisition unit may be implemented by specifically designed hardware or may be implemented by a software module. The distance information acquisition unit may also be implemented by a device such as a field programmable gate array (FPGA) or an application specific integrated circuit (ASIC) or may be implemented by the combination of these.

The photoelectric conversion system 300 is connected to a vehicle information acquisition apparatus 320, and is capable of acquiring vehicle information such as a vehicle speed, a yaw rate, and a steering angle. The photoelectric conversion system 300 is also connected to a control engine control unit (ECU) 330 that outputs a control signal for applying a braking force to a vehicle, based on a result of the determination by the collision determination unit 318. The photoelectric conversion system 300 is also connected to an alarm apparatus 340 that issues an alarm to a driver based on the result of the determination by the collision determination unit 318. For example, in a case where there is a high possibility of collision based on the result of the determination by the collision determination unit 318, the control ECU 330 performs vehicle control to avoid a collision or reduce damage by, for example, applying brakes, releasing an accelerator, or restraining engine power. The alarm apparatus 340 warns a user by, for example, generating an alarm sound, displaying alarm information on a screen of a navigation system, or applying vibrations to a seat belt or a steering wheel.

In the present exemplary embodiment, the photoelectric conversion system 300 images an area around the vehicle such as a front side or a rear side of the vehicle. FIG. 11B illustrates the photoelectric conversion system 300 in a case where the front side of the vehicle (an imaging range 350) is imaged. The vehicle information acquisition apparatus 320 transmits an instruction to the photoelectric conversion system 300 or the imaging apparatus 310. This configuration can improve the accuracy of ranging.

While the example of control for avoiding a collision with another vehicle is described above, the present exemplary embodiment is also applicable to control for automated driving to follow another vehicle, and control for automated driving not to stray from a traffic lane. Furthermore, the photoelectric conversion system 300 is not limited to the vehicle such as an automobile, and is applicable to, for example, a moving body (a moving apparatus) such as a ship, an airplane, or an industrial robot. In addition, the photoelectric conversion system is applicable to not only the moving body, but also an apparatus that widely uses object recognition, such as an intelligent transport system (ITS).

The present disclosure is not limited to the above-described exemplary embodiments, and the exemplary embodiments may be modified in a variety of ways.

For example, an example in which a part of the configuration according to any of the exemplary embodiments is added to any of the other exemplary embodiments, and an example in which a part of the configuration according to any of the exemplary embodiments is replaced with a part of the configuration according to any of the other exemplary embodiments are also included in the exemplary embodiments of the present disclosure.

In addition, the photoelectric conversion system according to each of the above-described seventh and eighth exemplary embodiments is an example of the photoelectric conversion system to which the photoelectric conversion apparatus according to any of the exemplary embodiments of the present disclosure is applicable. The photoelectric conversion system to which the photoelectric conversion apparatus according to any of the exemplary embodiments of the present disclosure is applicable is not limited to the configurations illustrated in FIG. 10 and FIGS. 11A and 11B.

While in the first to six exemplary embodiments, the descriptions are given with reference to the schematic diagram of the photoelectric conversion apparatus in FIG. 1, an exemplary embodiment of the present disclosure may have a laminated structure in which circuits are disposed on two or more semiconductor substrates and these substrates are bonded together. For example, a circuit is divided into two substrates, the pixel array 100 and the vertical scanning circuit 101 are disposed on the first substrate, and the column amplification circuit 102, the horizontal scanning circuit 103, and the control circuit 105 are disposed on the second substrate. This arrangement is merely an example, and does not limit the present disclosure. For example, the vertical scanning circuit 101 disposed on the first substrate may be disposed on the second substrate. While in the example in FIG. 1, the unit pixels 20 and the column amplification circuit 102 are electrically connected on a column-by-column basis, a signal amplification circuit may be connected to each of the unit pixels 20, for example. While the example in which the laminated structure including two substrates is descried above as an example, a laminated structure including three or more substrates may be provided by further dividing the circuits or adding a circuit or a function.

The above-described exemplary embodiments each merely represent an implementation example for carrying out the present disclosure, and the technical scope of the present disclosure is not to be construed in a limited way by these exemplary embodiments. The exemplary embodiments of the present disclosure can be carried out in various forms without departing from the technical ideas or the major characteristics thereof.

The image quality of a pixel including a depletion layer stopping layer and having an image plane phase difference AF function can be improved.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2021-063490, filed Apr. 2, 2021, which is hereby incorporated by reference herein in its entirety.

What is claimed is:

1. An apparatus comprising:
a plurality of pixels arranged on a substrate having a first surface where a transistor is disposed and a second surface opposite to the first surface,
wherein each of the plurality of pixels includes a conversion unit,
wherein the conversion unit includes a first semiconductor region of a first conductivity type, a second semiconductor region of a second conductivity type, and a third semiconductor region of the first conductivity type in order from a side of the second surface, and further includes an in-pixel separation portion of the second conductivity type,
wherein the second semiconductor region includes a first end and a second end opposing the first end,
wherein the conversion unit further includes a fourth semiconductor region between the first end and the second end,
wherein the in-pixel separation portion separates the first semiconductor region into a first region overlapping the first end and a second region overlapping the second end in a top view from the side of the second surface, and
wherein a concentration of an impurity of the second conductivity type in the fourth semiconductor region is lower than a concentration of an impurity of the second conductivity type in the in-pixel separation portion.

2. The apparatus according to claim 1, wherein the fourth semiconductor region and the in-pixel separation portion overlap each other in the top view from the side of the second surface.

3. The apparatus according to claim 1, wherein the fourth semiconductor region overlaps the first region and the second region in the top view from the side of the second surface.

4. The apparatus according to claim 1,
wherein the conversion unit further includes a pixel separation region of the second conductivity type that separates the plurality of pixels from each other, and
wherein a concentration of an impurity of the second conductivity type in the pixel separation region is higher than the concentration of the impurity of the second conductivity type in the in-pixel separation portion.

5. The apparatus according to claim 4, wherein, in a cross section intersecting a direction in which the in-pixel separation portion separates the first semiconductor region, a cross-sectional width of the in-pixel separation portion is less than a cross-sectional width of the pixel separation region.

6. The apparatus according to claim 1, wherein a surface of the in-pixel separation portion opposing the second surface is closer to the second surface than a surface of the first end on the side of the second surface.

7. The apparatus according to claim 4,
wherein the in-pixel separation portion is formed to be shallow in a depth direction of the substrate, and
wherein the pixel separation region is formed to be deeper than the in-pixel separation portion in the depth direction of the substrate.

8. The apparatus according to claim 1, wherein a concentration of an impurity of the second conductivity type in a third region of the in-pixel separation portion is lower than a concentration of an impurity of the second conductivity type in a fourth region of the in-pixel separation portion that is closer to the second surface than the third region.

9. The apparatus according to claim 1, wherein the third semiconductor region includes a fifth semiconductor region of the second conductivity type in a region overlapping the fourth semiconductor region in the top view from the side of the second surface.

10. The apparatus according to claim 9, wherein the fifth semiconductor region includes a portion overlapping the second semiconductor region in the top view from the side of the second surface.

11. The apparatus according to claim 1,
wherein the conversion unit has a first point and a second point in a range from the first semiconductor region to the third semiconductor region,
wherein the first point is closer to the first semiconductor region than the second point,
wherein the second point is closer to the third semiconductor region than the first point, and
wherein a potential at the first point is higher than a potential at the second point.

12. The apparatus according to claim 1,
wherein the second semiconductor region includes a first member and a second member,
wherein the first end is an end of the first member, and
wherein the second end is an end of the second member.

13. The apparatus according to claim 1, wherein each of the plurality of pixels is a pixel of a back surface irradiation type.

14. The apparatus according to claim 1, further comprising:
a light shielding portion that blocks incidence of light; and
a reference pixel arranged on the substrate and shielded by the light shielding portion,
wherein the reference pixel includes a sixth semiconductor region of the first conductivity type and a seventh semiconductor region of the second conductivity type in order from the side of the second surface,
wherein, between the second surface and the second semiconductor region in each of the plurality of pixels and between the second surface and the seventh semiconductor region in the reference pixel, a line parallel to the second surface is defined at a position halving the first semiconductor region of each of the plurality of pixels and the sixth semiconductor region of the reference pixel,
wherein, in a cross section taken along the line, a concentration of an impurity of the first conductivity type in the first semiconductor region of each of the plurality of pixels is higher than a concentration of an impurity of the first conductivity type in the sixth semiconductor region of the reference pixel.

15. A system comprising:
the apparatus according to claim 1; and
a signal processing unit configured to generate an image, using a signal output by the apparatus.

16. The system according to claim 15, wherein in the apparatus, the fourth semiconductor region and the in-pixel separation portion overlap each other in the top view from the side of the second surface.

17. The system according to claim 15, wherein in the apparatus, the fourth semiconductor region overlaps the first region and the second region in the top view from the side of the second surface.

18. The system according to claim 15,
wherein in the apparatus, the conversion unit further includes a pixel separation region of the second conductivity type that separates the plurality of pixels from each other, and
wherein in the apparatus, a concentration of an impurity of the second conductivity type in the pixel separation region is higher than the concentration of the impurity of the second conductivity type in the in-pixel separation portion.

19. A moving body comprising:
the apparatus according to claim 1; and
a control unit configured to control a movement of the moving body, using a signal output by the apparatus.

20. A substrate to be laminated on another substrate, the substrate comprising:
a first surface where a transistor is disposed;
a second surface opposite to the first surface; and
a plurality of pixels each including a conversion unit,
wherein the conversion unit includes a first semiconductor region of a first conductivity type, a second semiconductor region of a second conductivity type, and a third semiconductor region of the first conductivity type in order from a side of the second surface,
wherein the second semiconductor region includes a first end and a second end opposing the first end,
wherein the conversion unit further includes a fourth semiconductor region between the first end and the second end,
wherein the first semiconductor region includes an in-pixel separation portion of the second conductivity type that separates the first semiconductor region into a first region overlapping the first end and a second region overlapping the second end in a top view from the side of the second surface, and wherein a concentration of an impurity of the second conductivity type in the fourth semiconductor region is lower than a concentration of an impurity of the second conductivity type in the in-pixel separation portion.

\* \* \* \* \*